United States Patent [19]

Masuoka et al.

[11] Patent Number: 4,612,212
[45] Date of Patent: Sep. 16, 1986

[54] METHOD FOR MANUFACTURING E²PROM

[75] Inventors: Fujio Masuoka; Hisakazu Iizuka, both of Yokohama, Japan

[73] Assignee: Tokyo Shibaura Denki Kabushiki Kaisha, Japan

[21] Appl. No.: 721,431

[22] Filed: Apr. 9, 1985

Related U.S. Application Data

[62] Division of Ser. No. 320,936, Nov. 13, 1981, Pat. No. 4,531,203.

[30] Foreign Application Priority Data

Dec. 20, 1980 [JP] Japan .................... 55-180941
Dec. 20, 1980 [JP] Japan .................... 55-180952

[51] Int. Cl.⁴ .............................. H01L 29/27
[52] U.S. Cl. ........................ 427/91; 427/88; 148/DIG. 109
[58] Field of Search ............. 427/88, 91, 250, 99; 148/DIG. 109; 365/185, 218

[56] References Cited

U.S. PATENT DOCUMENTS 4,099,196  7/1978  Simko ............................ 357/23
4,203,158  5/1980  Frohman-Bentchkowsky et al. ........................ 365/185

OTHER PUBLICATIONS

1980 IEEE International Solid-State Circuit Conference 152 (Feb. 1980), A 16 Kb Electrically Erasable Nonvolatile Memory.
Kupec et al., Triple Level Poly-Silicon E²PROM with Single Transistor per Bit, 1980, IEEE.

Primary Examiner—Norman Morgenstern
Assistant Examiner—K. Jaconetty
Attorney, Agent, or Firm—Finnegan, Henderson, Farabow, Garrett & Dunner

[57] ABSTRACT

An erase gate is formed for erasing data from a floating gate in a semiconductor memory device having the floating gate and a control gate.

Furthermore, in order to achieve electrical insulation between the erase gate and the control gate, an insulating film formed between the erase gate and the control gate is made thicker than an insulating film formed between the floating gate and the erase gate.

5 Claims, 58 Drawing Figures

F I G. 16
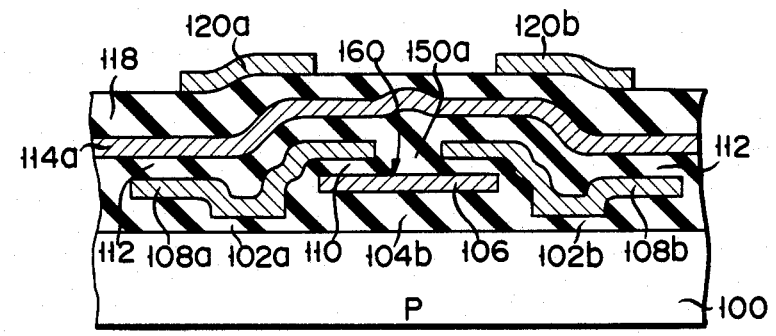
F I G. 17
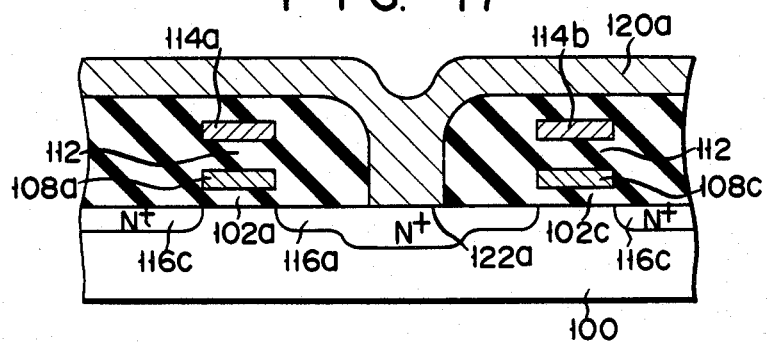
F I G. 18
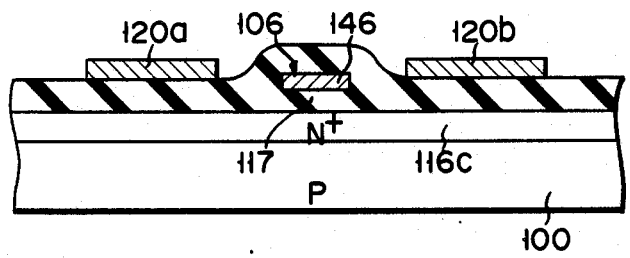

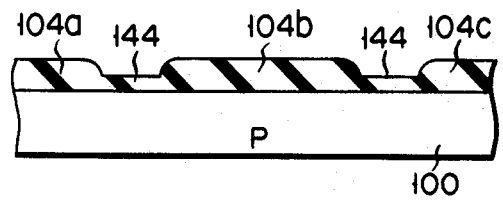
F I G. 20A
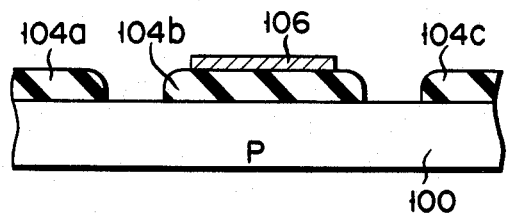
F I G. 20B
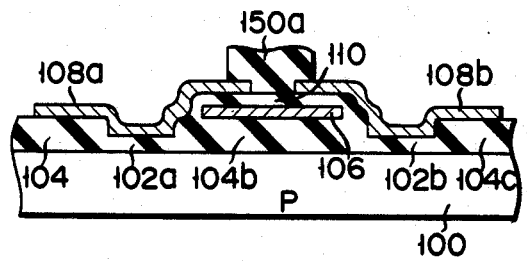
F I G. 20C
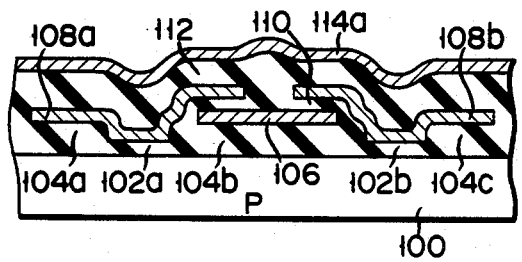
F I G. 20D
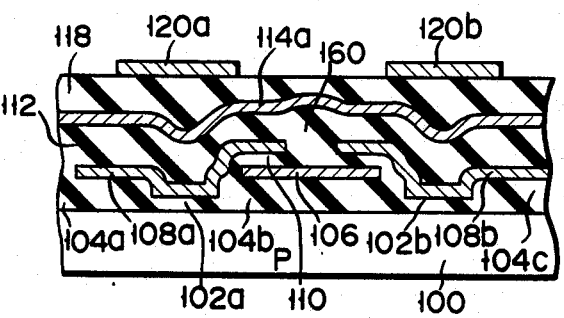
F I G. 20E F I G. 25E
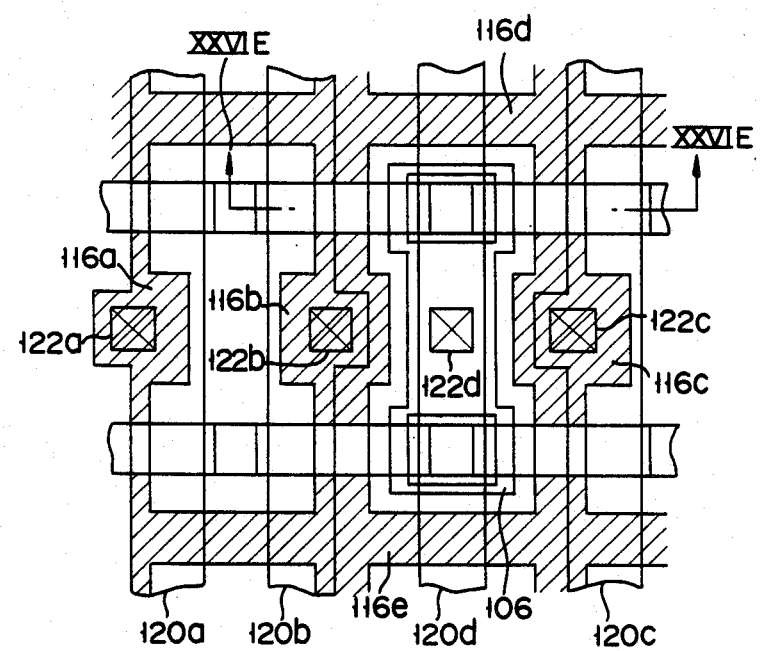

METHOD FOR MANUFACTURING E²PROM

This is a division of application Ser. No. 320,936, filed Nov. 13, 1981, now U.S. Pat. No. 4,531,203.

BACKGROUND OF THE INVENTION

The present invention relates to a semiconductor memory device suitable for an electrically erasable and electrically programmable read-only memory.

Writing and erasing of data after manufacture is possible with an erasable and electrically programmable read-only memory (EP-ROM). The EP-ROMs are roughly classified into the ultraviolet ray erasable type and into the electrically erasable type. A high packaging density may be accomplished with an EP-ROM of the ultraviolet ray erasable type, since one transistor may comprise one memory cell. The ultravoilet ray erasable type EP-ROMs of 32 kbit and 64 kbit have been developed so far. However, the EP-ROMs of the ultraviolet ray erasable type are defective in that manufacturing cost becomes high since a package is required which transmits the ultravoilet rays. On the other hand, a satisfactory packaging density may not be accomplished with the electrically erasable and programmable read-only memory (E²P-ROM) since at least two transistors constitute one memory cell. E²P-ROMs of 16 kbit have so far been developed. However, the E²P-ROMs of the electrically erasable type are advantageous in that manufacturing costs may be reduced by using a less expensive plastic material for the package.

FIG. 1 is a circuit diagram of a memory cell of a conventional E²P-ROM disclosed in "A 16 kb Electrically Erasable Nonvolatile Memory", ISSCC Digest of Technical Papers, February 1980, pp 152 to 153 and 271 by W. S. Johnson et al. This memory cell comprise two transistors Q1 and Q2. The transistor Q1 comprises a select MOS transistor and the transistor Q2 comprises a double gate type MOS transistor having a control gate 50 and a floating gate 52. One doped region of the transistor Q1 is connected to a digit line 54, and the other doped region thereof is connected to one doped region of the transistor Q2. The gate of the transistor Q1 is connected to a select line 56. The other doped region of the transistor Q2 is grounded, and the control gate thereof is connected to a data program line 58.

The conventional E²P-ROMs of the construction as described above have the following drawbacks:

(a1) As may be apparent from FIG. 1, one memory cell comprises two transistors. Therefore, the number of elements becomes twice that of the EP-ROMs of the ultraviolet ray erasable type, resulting in half the packaging density. The EP-ROMs of the electrically erasable type are inferior in packaging density to those of the ultraviolet ray erasable type.

(a2) Voltages of both polarities of positive and negative are required for writing and erasing data. Therefore, power sources of both polarities of positive and negative are required for mounting the E²P-ROMs of this type on a printed circuit board and for electrically writing and erasing data therein.

(a3) Extra circuits are required to simultaneously erase all the bits of words, resulting in a low packaging density.

(a4) It is difficult to erase all the bits within a short period of time.

(a5) It is impossible to erase data with a unipolar power source of 5 V, for example.

The E²P-ROM which eliminates the drawbacks described above is disclosed in "Triple Level Poly-silicon E²P-ROM with Single Transistor Per Bit", J. Kupec, W. M. Gosney, V. Mckenny, and V. Kowshik, IEDM, Dec. 1980, pp 602 to 606. A semiconductor memory device according to the present invention is an improvement over the E²P-ROM described above.

SUMMARY OF THE INVENTION

It is the first object of the present invention to eliminate drawbacks of the conventional semiconductor memory devices and to provide a semiconductor memory device which is capable of effectively emitting charge from a floating gate when data is erased.

It is the second object of the present invention to provide a method for manufacturing the semiconductor memory device.

In order to achieve the above and other objects, there is provided according to the present invention a semiconductor memory device wherein a MOS transistor has a floating gate for storing data and is further provided with an erase gate for erasing data from the floating gate, and an insulating film between the erase gate and a control gate is thicker than an insulating film between the floating gate and the erasing gate.

In order to ensure the insulating film of a sufficient thickness between the erase gate and the control gate, a step for forming an additional insulating film on the erase gate may be added.

When the semiconductor memory device is manufactured with the above construction, the insulating film between the erase gate and the control gate is formed to a sufficient thickness so that a leakage current does not flow between the erase gate and the control gate even if a high voltage is applied to the erase gate for erasing the data from the floating gate.

Further, if the thickness of the insulating film between the erase gate and the control gate is made greater than the sum of the thickness of the insulating film between the erase gate and the floating gate and the thickness of the insulating film between the floating gate and the control gate, still better effects are obtained.

BRIEF DESCRIPTION OF THE DRAWINGS

Other objects and advantages of the present invention will become apparent from the following detailed description when taken in conjuction with the accompanying drawings in which:

FIG. 16 is a sectional view along the line XVI—XVI of FIG. 15;

FIG. 17 is a sectional view along the line XVII—XVII of FIG. 15;

FIG. 18 is a sectional view along the line XVIII—XVIII of FIG. 15;

FIGS. 20A to 20E are sectional views along the lines XXA—XXA, XXB—XXB, . . . , XXE—XXE, respectively, of FIGS. 19A to 19E;

FIGS. 25A to 25E are plan views of the semiconductor substrate for explaining the method for manufacturing the semiconductor memory device according to the fourth embodiment of the present invention.

DETAILED DESCRIPTION OF THE PREFERRED EMBODIMENTS

Figure 2:
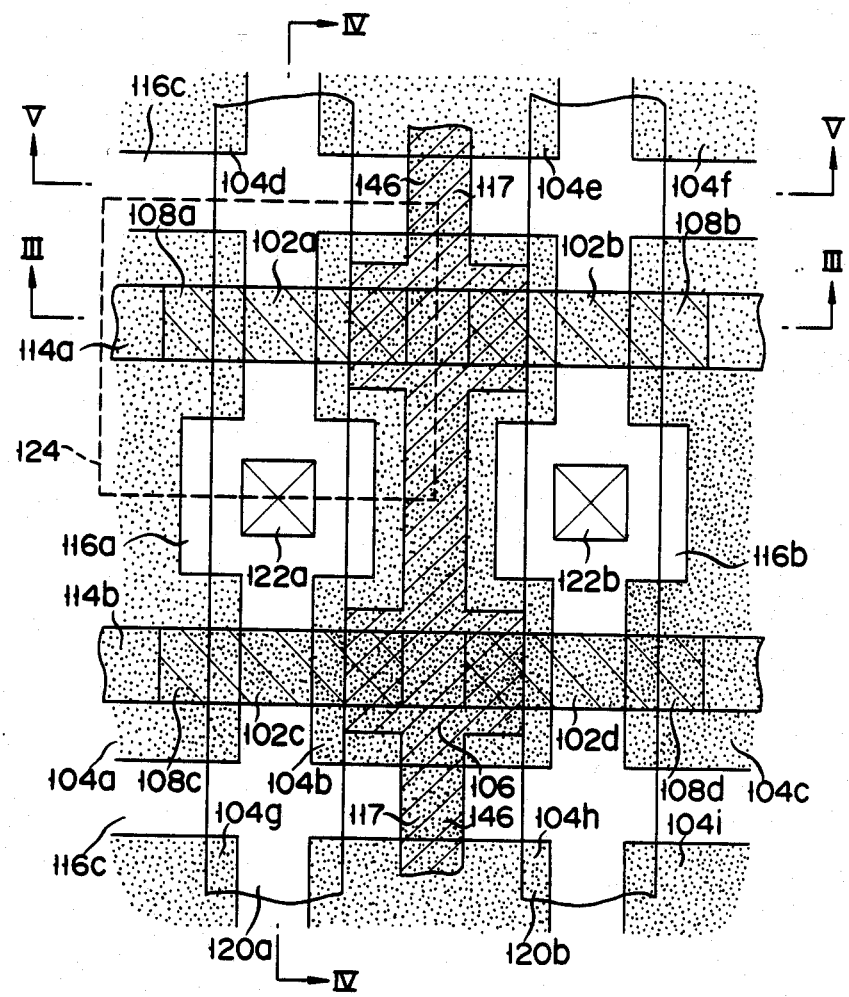
FIG. 2 is a plan view of the first embodiment of a semiconductor memory device of the present invention.
Figure 3:
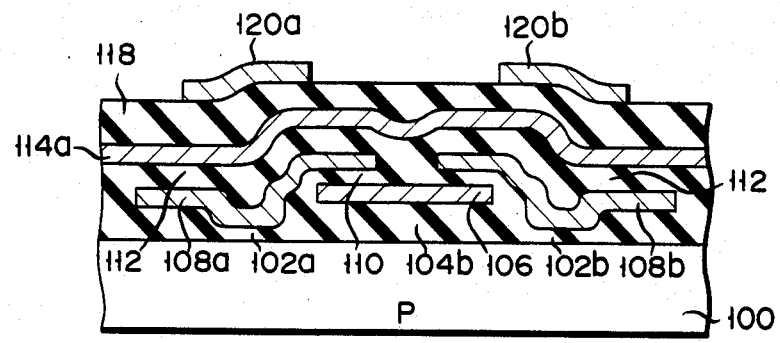
FIG. 3 is a sectional view along the line III—III of FIG. 2.
Figure 4:
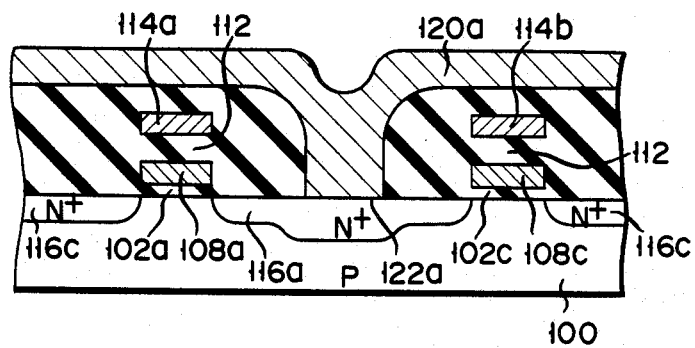
FIG. 4 is a sectional view along the line IV—IV of FIG. 2.
Figure 5:
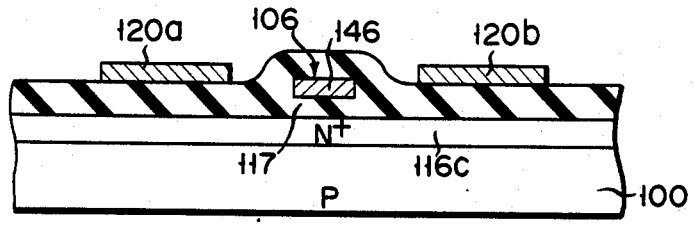
FIG. 5 is a sectional view along the line V—V of FIG. 2.

The first embodiment of the semiconductor memory device of the present invention will be described with reference to FIGS. 2 to 5 wherein FIG. 2 is a plan view of memory cells for 4 bits, FIG. 3 is a sectional view along the line III—III of FIG. 2, FIG. 4 is a sectional view along the line IV—IV of FIG. 2, and FIG. 5 is a sectional view along the line V—V of FIG. 2. Referring to FIG. 2, the doped regions of the semiconductor substrate are indicated by the clear areas, the oxide areas are indicated by the dotted areas, and the polycrystalline silicon members are indicated by the cross-hatched areas. Gate insulating films 102a, 102b, 102c and 102d of 500 Å thickness each are formed on the surface of a P-type semiconductor substrate 100 with equal intervals in an X-Y matrix form. On the surface of the semiconductor substrate 100 are also formed field insulating films 104a, . . . 104i. The field insulating film 104b of 1μ thickness is formed between the paired gate insulating films 102a and 102c and the paired gate insulating films 102b and 102d.

A first conductive layer 106 which has a thickness of 6,000 Å and which consists of polycrystalline silicon doped with phosphorus or arsenic is formed on the field insulating film 104b. Second conductive layers 108a, 108b, 108c and 108d which have a thickness of 5,000 Å and which consist of polycrystalline silicon are formed on the gate insulating films 102a, 102b, 102c and 102d, respectively, and are separate from one another. The right edges of the second conductive layers 108a and 108c overlap the left edge of the first conductive layer 106 with an insulating film 110 of 500 Å thickness interposed therebetween. The left edges of the second conductive layers 108b and 108d overlap the right edge of the first conductive layer 106 with this insulating film 110 interposed therebetween.

A third conductive layer 114a of polycrystalline silicon is formed through an insulating layer 112 which has a thickness of 1,000 to 2,000 Å above the second conductive layers 108a and 108b. The insulating film 112 is also formed between the first conductive layer 106 and the third conductive layer 114a. The third conductive layer 114a has substantially the same width as the second conductive layers 108a and 108b. A third conductive layer 114b of polycrystalline silicon is formed above the second conductive layers 108c and 108d with the insulating film 112 interposed therebetween. The insulating film 112 is also formed between the first conductive layer 106 and the third conductive layer 114b. The third conductive layer 114b has substantially the same width as the second conductive layers 108c and 108d. An N+-type semiconductor layer 116a is formed in a surface region of the semiconductor substrate 100 interposed by the gate insulating film 102a and the gate insulating film 102c. An N+-type semiconductor layer 116b is formed in a surface region of the semiconductor substrate 100 interposed by the gate insulating film 102b and the gate insulating film 102d. A continuous N+-type semiconductor layer 116c is formed on the surface region of the semiconductor substrate 100 which is opposite to the N+-type semiconductor layers 116a and 116b with respect to the gate insulating films 102a, 102b, 102c and 102d.

An insulating film 117 (FIG. 5) which has a thickness of 1,000 to 2,000 Å is formed at the part disposed between the N+-type semiconductor layer 116c and part 146 of the first conductive layer 106 which is not on the field insulating film. This insulating film 117 is so formed to have a thickness greater than those of the gate insulating films 102a to 102d. Fourth conductive layers 120a and 120b of aluminum are formed on the third conductive layers 114a and 114b with an insulating film 118 interposed therebetween. The conductive layer 120a and the N+-type semiconductor layer 116a are connected by a contact hole 122a. The conductive layer 120b and the N+-type semiconductor layer 116b are connected by a contact hole 122b. The N+-type semiconductor layer 116c is connected to a point of reference potential, for example, a point of ground potential.

A region 124 surrounded by the broken lines in FIG. 2 shows a memory cell for 1 bit of the semiconductor memory device. As may be apparent from FIG. 3, this memory cell is a MOS transistor having the second conductive layer 108a as a floating gate, the third conductive layer 114a as a control gate, the first conductive layer 106 as an erase gate, the N+-type semiconductor layer 116a as a drain, and the N+-type semiconductor layer 116c as a source. Referring to FIG. 3, the control gate 114a is commonly used for memory cells of 2 bits, and the erase gate 106 is commonly used for the memory cells of 4 bits. A pair of memory cells having the common gate 114a are formed symmetrical about the erase gate 106. The control gate 114a is formed on the semiconductor substrate 100 with an insulating film interposed therebetween. The floating gates 108a and 108b and the erase gate 106 are juxtaposed within the insulating film sandwiched by the control gate 114a and the semiconductor substrate 100. Since the erase gate 106 is formed on the field insulating film 104b, parts where the respective floating gates 108a and 108b and the erase gate 106 overlap are formed within the field region. At these overlapping parts, as shown in FIG. 3, the second conductive layer (floating gate) 108a is above the first conductive layer (erase gate) 106. Therefore, the distance between the semiconductor substrate 100 and the first conductive layer 106 is less than that between the semiconductor layer 100 and the second conductive layer 108a.

Figure 1:
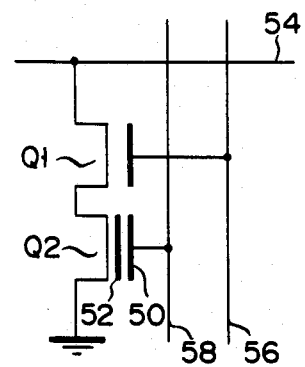
FIG. 1 is a circuit diagram of a memory cell of a conventional E²P-ROM.
Figure 6:
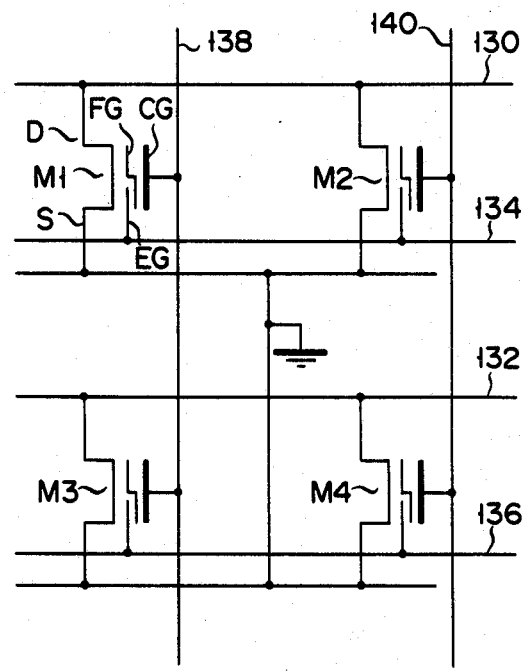
FIG. 6 is an equivalent circuit diagram of the semiconductor memory device shown in FIG. 2.

FIG. 6 is an equivalent circuit diagram of the semiconductor memory device shown in FIG. 2. Digit lines 130 and 132 correspond to the fourth conductive layers 120a and 120b, respectively, shown in FIG. 2, erase lines 134 and 136 correspond to the first conductive layer 106, and select lines 138 and 140 correspond to the third conductive layers 114a and 114b. Each of memory cells M1 to M4 comprises a control gate CG, floating gate FG, an erase gate EG, a drain D and a source S. The drains D of the memory cells M1 and M2 are connected to the digit line 130, the drains D of the memory cells M3 and M4 are connected to the other digit line 132, and the sources S of all the memory cells are connected to a point of gound potential.

The mode of operation of the semiconductor memory device of the present invention will be described with reference to the equivalent circuit diagram shown in FIG. 6. Description will be made with particular reference to the memory cell M1 shown in FIG. 6. Since the electrons are not injected to the floating gate FG of the memory cell M1 at the initial condition, the threshold voltage $V_{TH}$ of the memory cell M1 is at a low level.

For writing data in this memory cell M1, a high voltage of positive polarity such as +20 V is applied to the select line 138, and a high voltage of positive polarity such as +20 V is applied to the digit line 130. Then, thermions flow from the source S to the drain D of the memory cell M1 and these thermions are injected to the floating gate FG from the channel region formed between the source and the drain. As a result of this, the threshold voltage $V_{TH}$ of the memory cell M1 is raised. For writing data, it is also possible to apply a high voltage pulse such as +20 V, or a dc voltage of +5 or 0 V to the erase line 134, or to open the erase line 134. It thus suffices to apply a predetermined voltage across the source and the drain and to apply a voltage of the same polarity to the first and third conductive layers.

For reading data from the memory cell M1, the select line 138 is selected and a high voltage such as +5 V is applied to the control gate CG of the memory cell M1.

If the threshold voltage $V_{TH}$ is low when the high voltage is applied, the memory cell M1 is turned on. Then, a current flows from the digit line 130 through the memory cell M1 to the point of ground potential. If the threshold voltage $V_{TH}$ is high when the high voltage is applied, this memory cell M1 is off-state and the current does not flow. If logic level "1" is assigned to the condition wherein the current flows through the memory cell M1, and logic level "0" is assigned to the condition wherein the current does not flow through the memory cell M1, this memory cell may be used as a memory device. Since the floating gate FG is surrounded by the insulating films so as to be insulated from other elements, the electrons injected to the floating gate cannot be emitted outside the floating gate under the normal conditions. Therefore, this memory cell may be used as a nonvolatile memory device.

For erasing the data which has been written, the select line 138 and the digit line 130 are set at 0 V and a high voltage pulse such as +40 V is applied to the erase line 134. When this voltage is applied, field emission is caused between the floating gate FG and the erase gate EG of the memory cell M1 so that the electrons stored in the floating gate FG are emitted to the outside through the erase gate EG and the erase line 134. Consequently, the threshold voltage $V_{TH}$ of the memory cell M1 is restored to the low level as in the initial condition.

For erasing data, it suffices to set the source region, the drain region, and the third conductive layer at substantially the same potential and to apply a voltage of the same polarity as that for writing data to the first conductive layer. If the voltage to be applied to the first conductive layer is greater than that to be applied to the first conductive layer for writing data, erasing of data may be performed with better efficiency.

In erasing data, a high voltage is applied to the erase line 134. However, since an insulating film 117 (FIGS. 2 and 5) thicker than the gate insulating films 102a, 102b, 102c and 102d is formed between the N+-type semiconductor layer 116c and the part 146 of the first conductive layer which is on the regions other than the field insulating film 104b, the leakage current does not flow through this part.

The semiconductor memory device of the above construction has various advantages to be described below:

(b1) One transistor may constitute one memory cell which is capable of electrically erasing data. Therefore, the packaging density of the E²P-ROMs may be made substantially the same for the EP-ROMs of the ultraviolet ray erasable type. Since less expensive plastic material may be used for the package, the manufacturing cost is less than that of the EP-ROMs of the ultraviolet erasable type.

(b2) Writing, erasing and reading out data may be performed with unipolar power sources. Power sources are only required to apply +20 V for writing, +40 V for erasing, and +5 V for reading, all of the positive polarity. Furthermore, it is possible to use only a single power source, that is, to dispense with all the other power sources by obtaining +20 V and +40 V from a voltage of +5 V through a booster. Since all the power sources may be mounted on the printed circuit board, the semiconductor memory device of the present invention is capable of writing, erasing and reading out data.

(b3) Unlike conventional E²P-ROMs, the transistor for bit selection is unnecessary. Therefore all the bits of data may be erased in units of words with ease.

(b4) Since the field emission is utilized for erasing data, data may be erased in a short period of time.

(b5) Since data is written by the injection of thermions and data is erased by the field emission, the insulating films around the floating gate may be formed relatively thick. Therefore, the nonvolatile characteristics, that is, the data holding characteristics, may be improved.

(b6) The method for manufacturing the memory cell described above only requires the process for forming a three-layered polycrystalline silicon film by the conventional silicon gate process and requires no other processes.

(b7) Since the thickness of the field insulating film below the erase gate is greater than that of the insulating film interposed between the erase gate and the floating gate, application of a high voltage to the erase gate for erasing of data only results in discharge between the floating gate and erase gate and does not result in discharge between the semiconductor substrate and the erase gate.

(b8) Since the insulating film 112 which has a thickness of at least 1,000 to 2,000 Å is formed between the erase gate and the control gate in the semiconductor memory device in the above embodiment, the erase gate is sufficiently electrically insulated from the control gate. Furthermore, since the insulating film formed between the erase gate and the control gate is thicker than the insulating film formed between the erase gate and the floating gate, a leakage current does not flow between the erase gate and the control gate even if a high voltage is applied to the erase gate. Therefore, data from the floating gate can be efficiently erased.

In the embodiment described above, the floating gate is located above the erase gate at the part where the floating gate overlaps the erase gate. However, the floating gate may be formed below the erase gate at this part. In this case, since the capacitance between the control gate and the floating gate becomes small, an extra voltage must be applied for reading out and writing data.

Figure 7A:
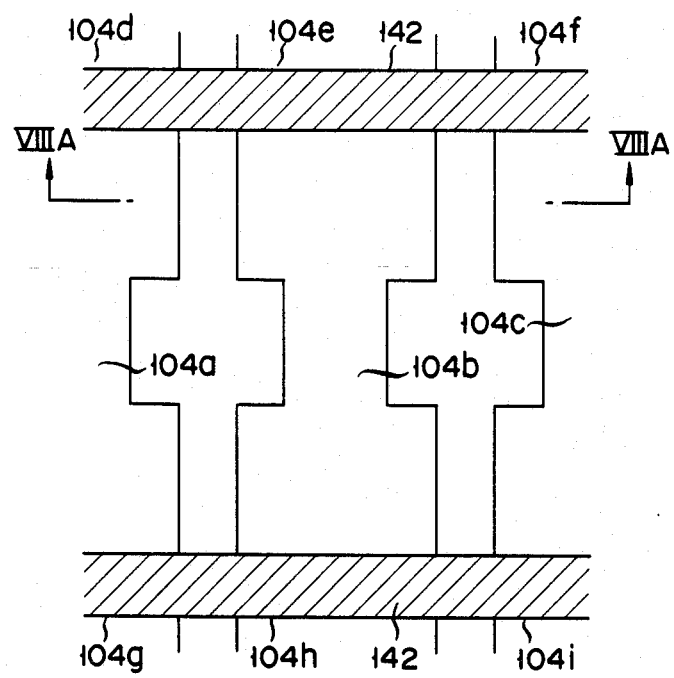
FIGS. 7A to 7E are plan views for explaining the method for manufacturing the semiconductor memory device according to the first embodiment of the present invention.
Figure 7B:
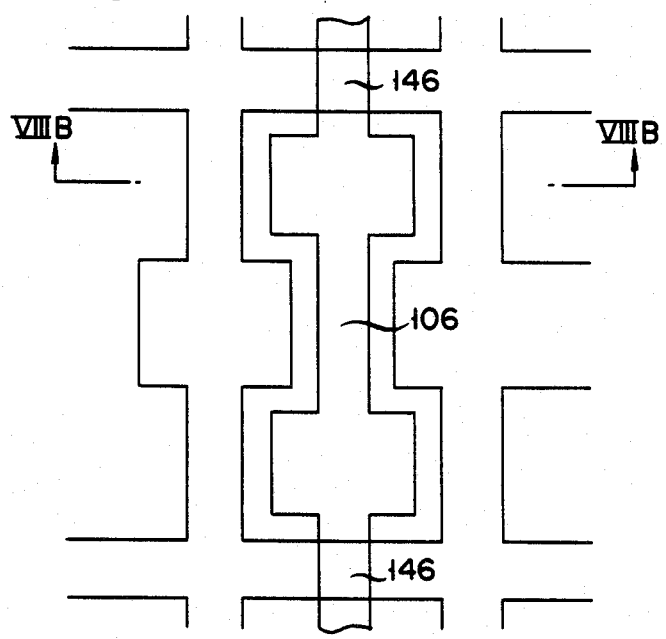

The method for manufacturing the semiconductor memory device shown in FIG. 2 will now be described with reference to FIGS. 7A to 7E and FIGS. 8A to 8E. FIGS. 7A to 7E are plan views of the semiconductor substrate and FIGS. 8A to 8E are sectional views along the lines VIIIA—VIIIA, VIIIB—VIIIB, . . . VIIIE—VIIIE, respectively, of FIGS. 7A to 7E. As shown in FIGS. 7A and 8A, an insulating film of 1μ thickness is grown on the surface of the P-type silicon semiconductor substrate 100, and the field insulating films 104a, 104b, . . . 104i are formed by photolithography. In each of regions 142 indicated by hatched lines in FIG. 7A, is selectively diffused phosphorus or arsenic by the ion-implantation method or diffusion method. After this step of diffusing an impurity, the parts of the surface of the semiconductor substrate 100, other than those where the field insulating films 104a to 104i are formed, are exposed. On the exposed surfaces, a thermally oxidized film 144 of a relatively small thickness, i.e., 1,000 to 2,000 Å, is formed by the thermal oxidation method.

Figure 8A:
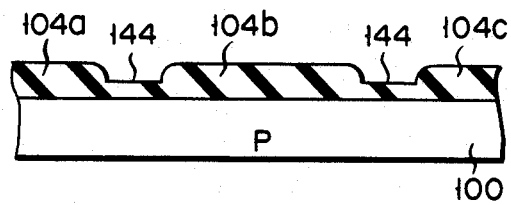
FIGS. 8A to 8E are sectional views along the lines VIIIA—VIIIA, VIIIB—VIIIB, . . . , VIIIE—VIIIE, respectively, of FIGS. 7A to 7E.
Figure 8B:
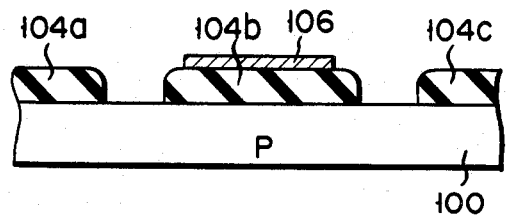

A polycrystalline silicon layer of 6,000 Å thickness is grown on the entire surface of the structure, and phosphorus or arsenic is doped in this polycrystalline silicon. This polycrystalline silicon layer is etched by photolithography to form the first conductive layer 106 as shown in FIGS. 7B and 8B. Using the first conductive layer as a mask, the thermally oxidized film 144 is removed and thereby forms the insulating film 117, having a thickness of 1,000 to 2,000 Å, below the part 146 of the first conductive layer 106. It is to be noted that the first conductive layer may be formed over the field insulating films 104a and 104c, adjacent to the field insulating film 104b.

Figure 7C:
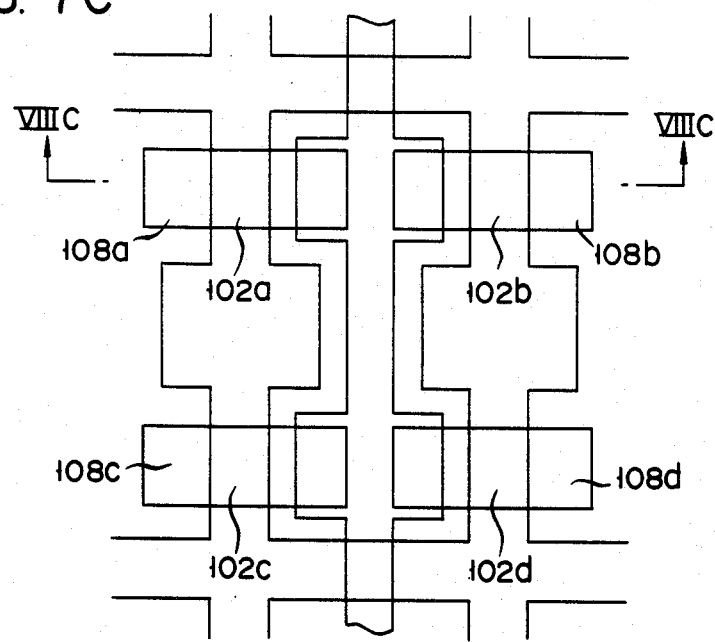
Figure 8C:
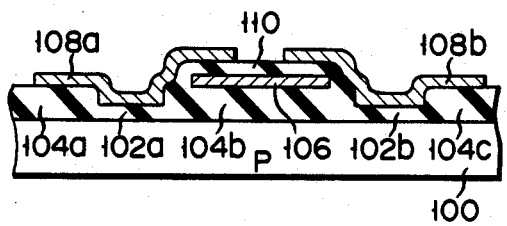

In the next step as shown in FIGS. 7C and 8C, the gate insulating films 102a, 102b, 102c and 102d and the insulating film 100 having a thickness of 500 Å, are formed by the thermal oxidation method on the exposed semiconductor substrate 100 and the first conductive layer 106. A polycrystalline silicon layer of 5,000 Å thickness is grown thereover by the CVD method. The second conductive layers 108a, 108b, 108c and 108d are formed on the gate insulating films 102a, 102b, 102c and 102d by photolithography.

Figure 7D:
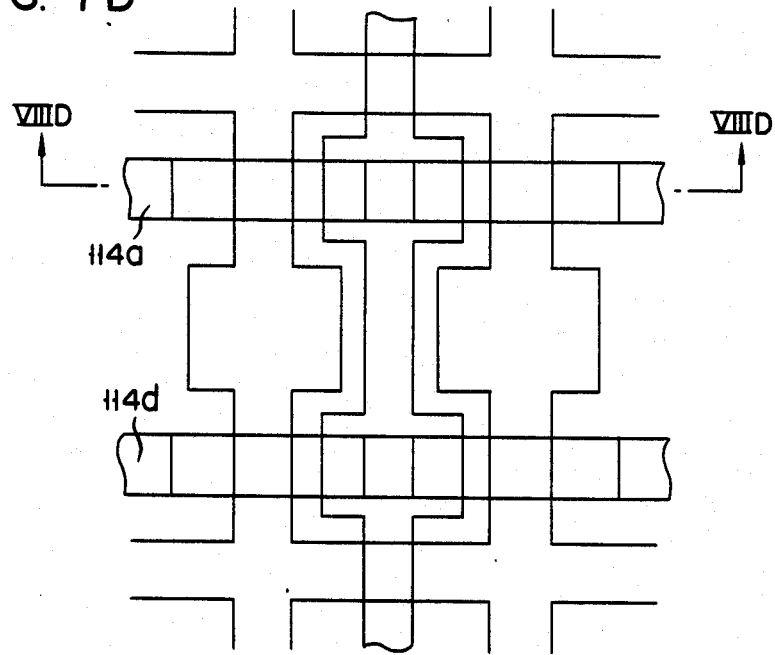
Figure 8D:
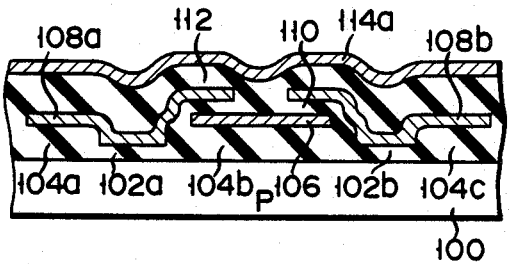

In the next step shown in FIGS. 7D and 8D, the insulating film 112, which has a thickness of 1,000 to 2,000 Å, is formed by the thermal oxidation method and a polycrystalline silicon layer is formed thereover. The polycrystalline silicon layer is etched by photolithography to form the third conductive layers 114a and 114i b which are to function as the control gates. Then, using the third conductive layers as a mask, the second conductive layers 108a, 108b, 108c and 108i d are etched to form the floating gates in a self-aligned manner.

Figure 7E:
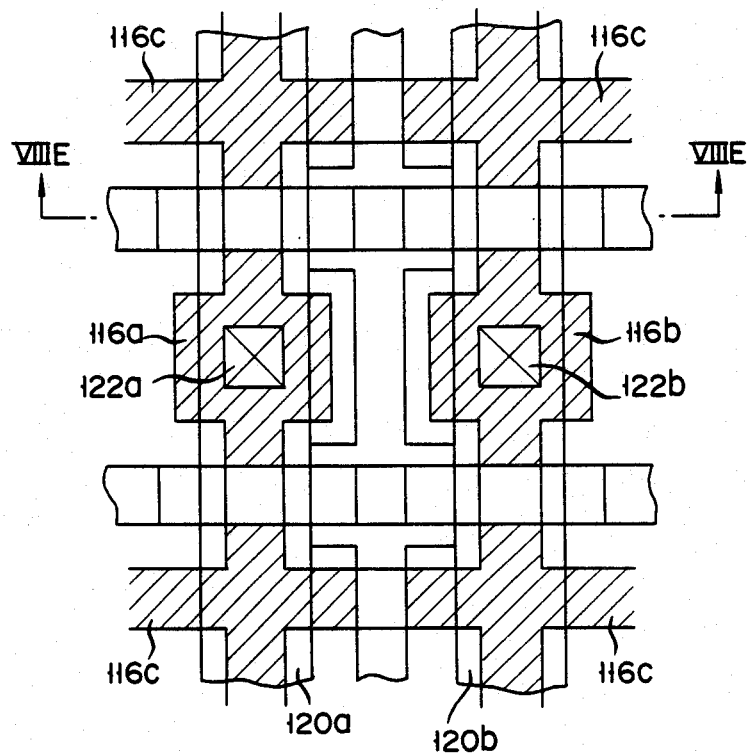
Figure 8E:
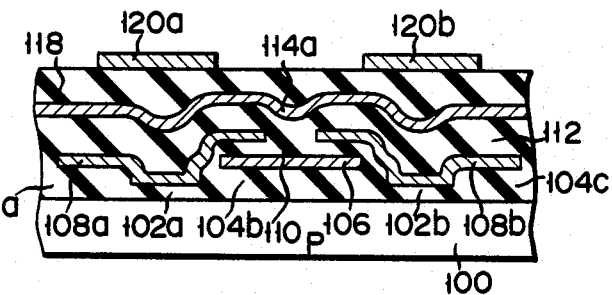

In the next step, using as a mask the second conductive layers 108a to 108d, the third conductive layers 114a and 114b, and the field insulating films 104a to 104i, phosphorus or arsenic is diffused in the regions indicated by the hatched lines in FIG. 7E to form the N+-type semiconductor layers 116a, 116b, and 116c. Thereafter, the insulating film 118 is deposited over the entire surface of the structure as shown in FIGS. 7E and 8E, to selectively form contact holes in the insulating film 118 which reach the N+-type semiconductor layers 116a and 116b. An aluminum film is then deposited over the insulating film 118 and the aluminum film is selectively etched by photolithography to form the fourth conductive layers 120a and 120b. The fourth conductive layers 120a and 120b are connected to the N+-type semiconductor layers 116a and 116b through the contact holes 122a and 122b, respectively.

The present invention is not limited to the embodiment described above. For example, it is also possible to form the first conductive layer on the field insulating film 104a and to make the other edges of the second conductive layers 108a and 108c overlap, with an insulating film interposed therebetween, with the first conductive layer on the field insulating film 104a. Alternatively, it is also possible to form the first conductive layer on the field insulating film 104c and to make the other edges of the second conductive layers 108b and 108d overlap, with an insulating film interposed therebetween, with the first conductive layer on the field insulating film 104c.

In the above embodiment, the first conductive layer 106 functions as the erase gate is common to the floating gates which are symmetrically arranged about this conductive layer. However, it is to be understood that the erase gate may be so formed as to erase the data of floating gate of only one memory cell.

The first conductive layer 106 and the second conductive layers 108a to 108d may be made of molybdenum.

Figure 9:
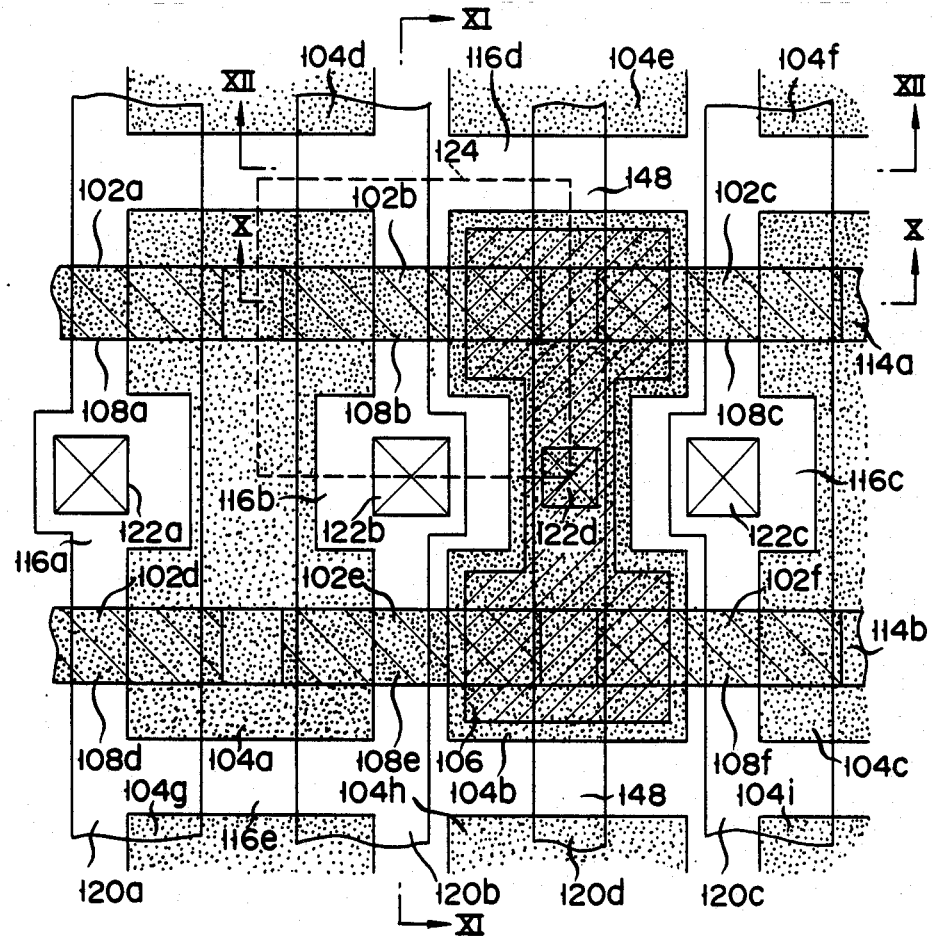
FIG. 9 is a plan view of the second embodiment of the semiconductor memory device of the present invention.
Figure 10:
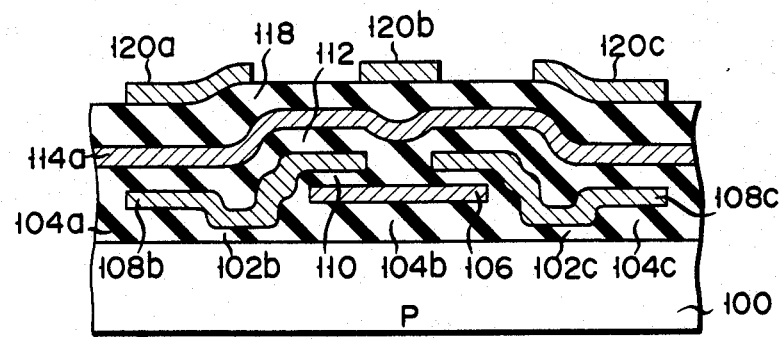
FIG. 10 is a sectional view along the line X—X of FIG. 9.
Figure 11:
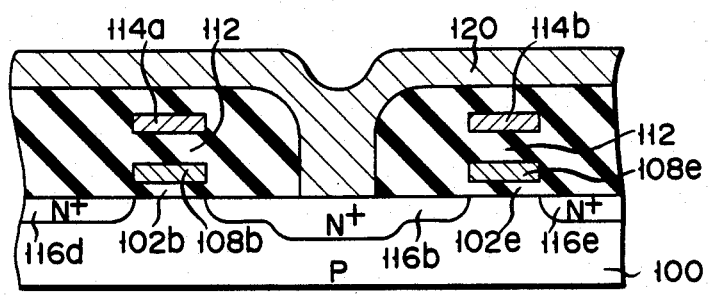
FIG. 11 is a sectional view along the line XI—XI of FIG. 9.

The second embodiment of the semiconductor memory device of the present invention will now be described referring to FIGS. 9 to 12. FIG. 9 is a plan view of a plurality of memory cells, FIG. 10 is a sectional view along the line X—X of FIG. 9, FIG. 11 is a sectional view along the line XI—XI of FIG. 9, and FIG.

12 is a sectional view along the line XII—XII of FIG. 9. Referring to FIG. 9, the doped regions of the semiconductor substrate 100 are indicated by the clear areas, the oxide areas are indicated by the dotted areas, and the polycrystalline silicon members are indicated by the cross-hatched areas.

The gate insulating films 102a to 102f of 500 Å thickness are formed on the surface of the P-type silicon semiconductor substrate 100 with equal intervals therebetween in an X-Y matrix form. The field insulating films 104a, 104b . . . , 104i are also formed on the surface of the semiconductor substrate 100. The field insulating film 104a is formed between the paired gate insulating films 102a and 102d and the paired gate insulating films 102b and 102e. The field insulating film 104b is formed between the paired gate insulating films 102b and 102e and the paired gate insulating films 102c and 102f. The field insulating film 104c is formed at the other edges of the paired gate insulating films 102c and 102f. The first conductive layer 106, having a thickness of 6,000 Å and consisting of polycrystalline silicon doped with phosphorus or arsenic, is formed in an island form. The second conductive layers 108a, 108b, 108c, 108d, 108e and 108f, having a thickness of 5,000 Å and consisting of polycrystalline silicon, are formed on the gate insulating films 102a, 102b, 102c, 102d, 102e and 102f, respectively, to be separate from each other. The respective right edges of the second conductive layers 108b and 108e overlap the left edge of the first conductive layer 106 with the insulating film 110 of 500 Å thickness interposed therebetween. The left edges of the second conductive layers 108c and 108f also overlap the right edge of the first conductive layer 106 with the insulating film 110 interposed therebetween. The third insulating film 112, which has a thickness of 1,000 to 2,000 Å and which consists of polycrystalline silicon, is formed on the second conductive layers 108a, 108b and 108c with the insulating film 112 interposed therebetween. The film 112 lies also between the first conductive layer 106 and the third conductive layer 114a. The third conductive layer 114a has substantially the same width as those of the second conductive layers 108a, 108b and 108c. The third conductive layer 114b of polycrystalline silicon is formed on the second conductive layers 108d, 108e and 108f with the insulating film 112 interposed therebetween. The film 112 lies also between the first conductive layer 106 and the third conductive layer 114b. The third insulating film 114b also has the same width as those of the second conductive layers 108d, 108e and 108f.

The N+-type semiconductor layer 116a is formed on the surface region of the semiconductor substrate 100 which is disposed between the gate insulating film 102a and the gate insulating film 102d. The N+-type semiconductor layer 116b is formed on the surface region of the semiconductor substrate 100 which is disposed between the gate insulating film 102b and the gate insulating film 102e. The N+-type semiconductor layer 116c is formed on the surface region of the semiconductor substrate 100 which is disposed between the gate insulating film 102c and the gate insulating film 102f. The continuous N+-type semiconductor layer 116d is formed on the surface region of the semiconductor substrate 100 which is opposite to the N+-type semiconductor layers 116a, 116b and 116c with respect to the gate insulating films 102a, 102b and 102c. A continuous semiconductor layer 116e is formed on the surface region of the semiconductor substrate 100 which is opposite to the N+-type semiconductor layers 116a, 116b and 116c with respect to the gate insulating films 102d, 102e and 102f.

Figure 12:
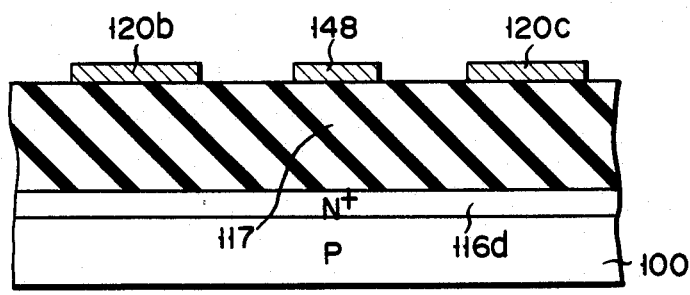
FIG. 12 is a sectional view along the line XII—XII of FIG. 9.

The fourth conductive layers 120a, 120b, 120c and 120d, all of aluminum, are formed with the insulating film 118 interposed therebetween, on the third conductive layers 114a and 114b and the first conductive layer 106. The fourth conductive layer 120a and the N+-type semiconductor layer 116a are connected through the contact hole 122a. The fourth conductive layer 120b and the N+-type semiconductor layer 116b are connected through the contact hole 122b. The fourth conductive layer 120c and the N+-type semiconductive layer 116c are connected through a contact hole 122c. The fourth conductive layer 120d is connected to the first conductive layer 106 through a contact hole 122d. The insulating film 117 of a thickness greater than that for the first embodiment is disposed between a part 148 of the fourth layer 120d which is not on the field insulating film 104b and the N+-type semiconductor layers 116d and 116e (FIG. 12). The thickness of the insulating film 117 is greater than those of the gate insulating films 102a to 102f. The N+-type semiconductor layers 116d and 116e are connected to a point of reference potential, for example, a point of ground potential.

The region 124 indicated by the broken line in FIG. 9 indicates a memory cell for 1 bit of the semiconductor memory device. This memory cell is a MOS transistor which has, as is apparent from FIG. 9, the second conductive layer 108b as a floating gate, the third conductive layer 114a as a control gate, the first conductive layer 106 as an erase gate, the N+-type semiconductor layer 116b as a drain, and the N+-type semiconductor layer 116d as a source. As may be seen from FIG. 10, the control gate 114a is common to memory cells for 2 bits, and the island-shaped erase gate 106 is formed commonly for the memory cells for 4 bits. A pair of memory cells having the common control gate 114a are formed symmetrically about the erase gate 106. The control gate 114a is formed on the semiconductor substrate 100 with the insulating film interposed therebetween. The floating gates 108b and 108c, and the erase gate 106 are juxtaposed in the insulating film interposed between the erase gate 114a and the semiconductor substrate 100. Since the erase gate 106 is formed on the field insulating film 104b, parts of the floating gates 108b and 108c overlapping with the erase gate 106 are present in the field region. As also seen from FIG. 10, at this overlapping part, the floating gate (the second conductive layer) 108a is located above the erase gate (the first conductive layer) 106. Therefore, the distance between the semiconductor substrate 100 and the first conductive layer 106 is smaller than the distance between the semiconductor substrate 100 and the second conductive layer 108a.

The equivalent circuit of the semiconductor memory device shown in FIGS. 9 to 11 is of the same configuration as that shown in FIG. 6. The operation of this equivalent circuit is also the same as that in the first embodiment, so that the description thereof will be omitted.

The second embodiment of the present invention has, in addition to the eight advantages of the first embodiment, two more advantages described below:

(b9) Since the erase line comprises the fourth conductive layer 120d of aluminum, the thick insulating film 117 may be formed between the N+-type semiconductor layers 116d and 116e and the part 148 of the fourth conductive layer formed on the region other than on the field insulating film 104b. Consequently, the current leakage is not caused even if a high voltage is applied to the erase line.

(b10) The fourth conductive layer 120d and the erase gate for 4 bits may be connected through a single contact hole if the erase gate is formed to be common for memory cells for 4 bits as in the second embodiment. Therefore, the number of the contact holes may be reduced and the packaging density may be improved.

As mentioned above, in the second embodiment of the semiconductor memory device also, the insulating film provided between the erase gate and the control gate is made thicker than the insulating film provided between the erase gate and the floating gate. This makes it possible to erase data from the floating gate with a high efficiency.

Figure 13A:
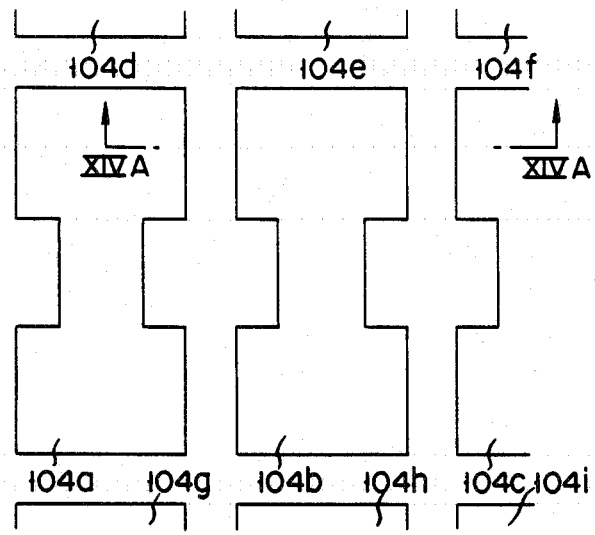
FIGS. 13A to 13E are plan views of the semiconductor substrate for explaining the method for manufacturing the semiconductor memory device according to the second embodiment of the present invention.
Figure 13B:
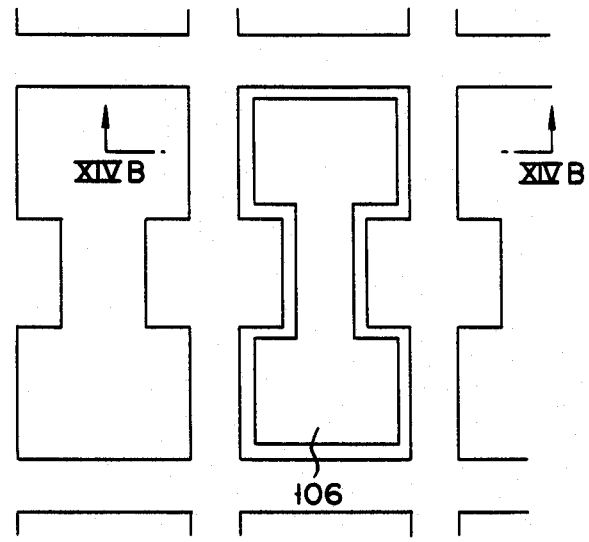

The method for manufacturing the semiconductor memory device of the second embodiment will be described with reference to FIGS. 13A to 13E and FIGS. 14A to 14E. FIGS. 13A to 13E are plan views of the semiconductor substrate, and FIGS. 14A to 14E are sectional views along the lines XIVA—XIVA, XIVB—XIVB, ..., XIVE—XIVE, respectively, of FIGS. 13A to 13E. As shown in FIGS. 13A and 14A, an insulating film of 1μ thickness is grown on the surface of the P-type silicon semiconductor substrate 100. The field insulating films 104a, 104b, 104c, 104d, 104e, 104f, 104g, 104h and 104i are formed by photolithography. A polycrystalline silicon layer of 6,000 Å thickness is grown over the entire surface of the structure. Phosphorus or arsenic is doped in this polycrystalline silicon layer. The polycrystalline silicon layer is etched by photolithography to form the first conductive layer 106 on the field insulating film 104b as shown in FIGS. 13B and 14B. The first conductive layer may also be formed as needed on the field insulating films 104a, 104b 104c, 104d, 104e, 104f, 104g, 104h and 104i which are adjacent to the field insulating film 104b.

Figure 13C:
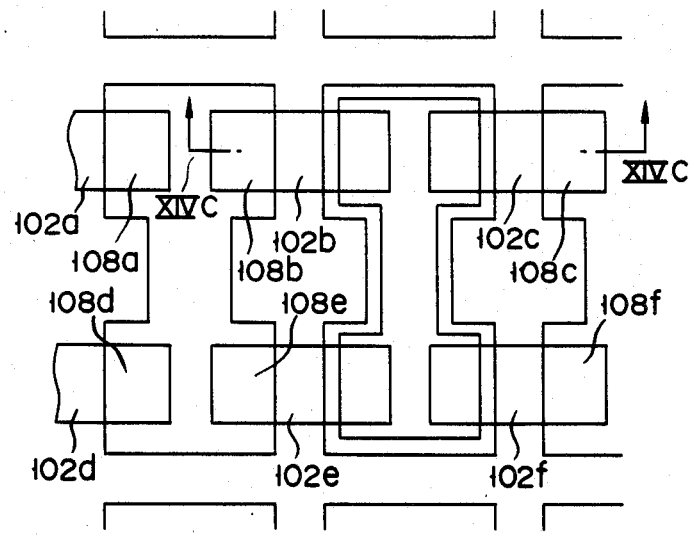
Figure 14A:
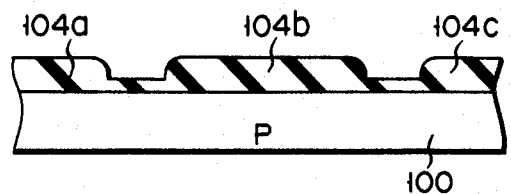
FIGS. 14A to 14E are sectional views along the lines XIVA—XIVA, XIVB—XIVB, . . . , XIVE—XIVE, respectively, of FIGS. 13A to 13E.
Figure 14B:
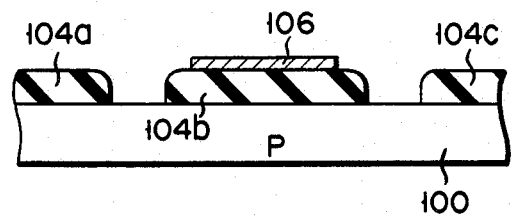
Figure 14C:
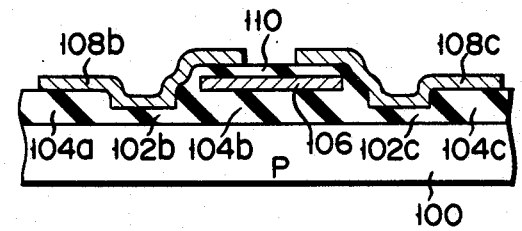

In the next step, as shown in FIGS. 13C and 14C, the insulating film 110 and the gate insulating films 102a, 102b, 102c, 102d, 102e and 102f which have a thickness of 500 Å are formed by the thermal oxidation method on the first conductive layer 106 and the exposed semiconductor substrate 100, respectively. A polycrystalline silicon layer of 5,000 Å is grown by the CVD method thereover, and the second conductive layers 108a to 108f as the floating gates are formed on the gate insulating films 102a to 102f and the insulating film 110.

Figure 13D:
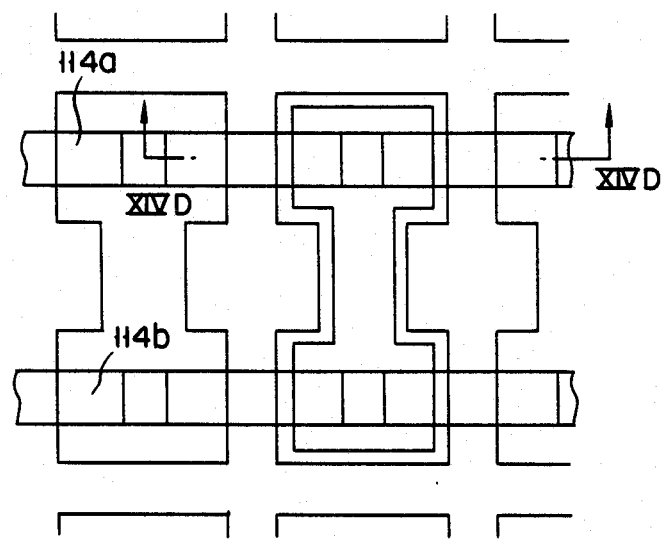
Figure 14D:
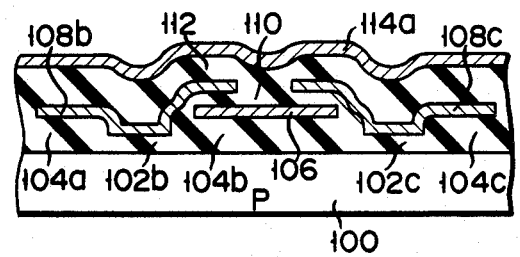

In the next step as shown in FIGS. 13D and 14D, the insulating film 112 which has a thickness of 1,000 to 2,000 Å is formed by the thermal oxidation method, and a polycrystalline silicon layer is formed thereover. The polycrystalline silicon layer is etched by photolithography to form the third conductive layers 114a and 114b to function as the control gates. Using the third conductive layers as a mask, the second conductive layers 108a to 108f are etched to form the floating gates in a self-aligned manner.

Figure 13E:
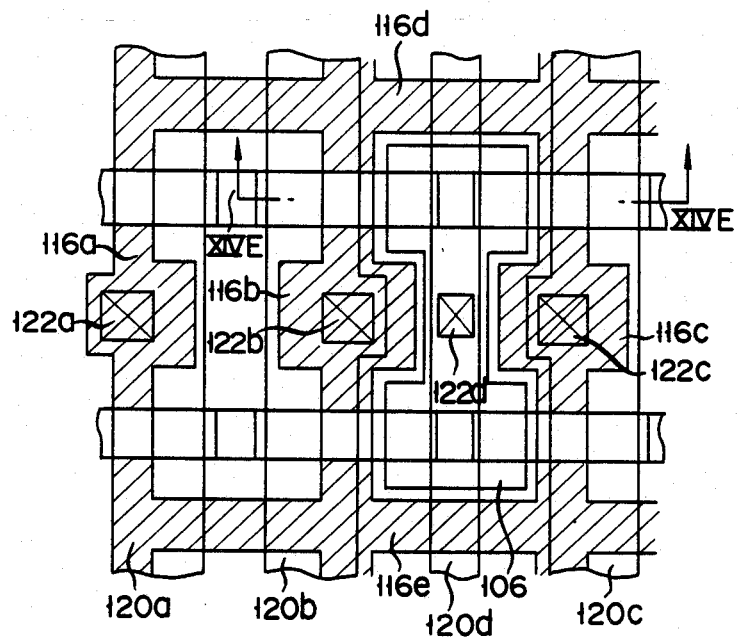
Figure 14E:
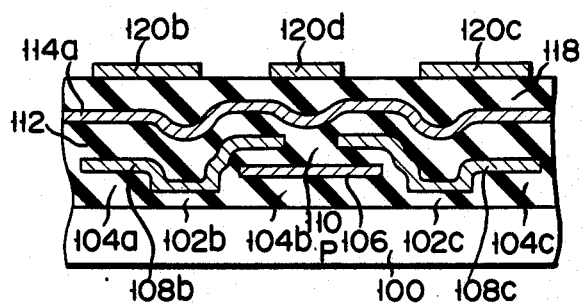

Using as a mask the second conductive layers 108a to 108f, the third conductive layers 114a and 114b, and the field insulating films 104a to 104i, phosphorus or arsenic is doped in the region indicated by the hatched lines in FIG. 13E to form the N+-type semiconductor layers 116a, 116b and 116c as the drains and N+-type semiconductor layers 116d and 116e as the sources. Thereafter, as shown in FIGS. 13E and 14E, the insulating film 118 is deposited on the entire surface of the structure and holes are selectively formed which extend to the N+-type semiconductor layers 116a, 116b and 116c and the first conductive layer 106. After an aluminum film is deposited over the insulating film 118, this aluminum film is selectively etched by photolithography to form the fourth conductive layers 120a, 120b, 120c and 120d. The fourth conductive layers 120a, 120b and 120c are connected to the N+-type semiconductor layers 116a, 116b and 116c through the contact holes 122a, 122b and 122c, respectively. The fourth conductive layer 120d is connected to the first conductive layer 106 through the contact hole 122d.

In the second embodiment, one erase gate is commonly formed for memory cells for 4 bits. However, it is also possible to form one erase gate for a memory cell for 1 bit or to form one erase gate for memory cells for 2 bits.

Figure 15:
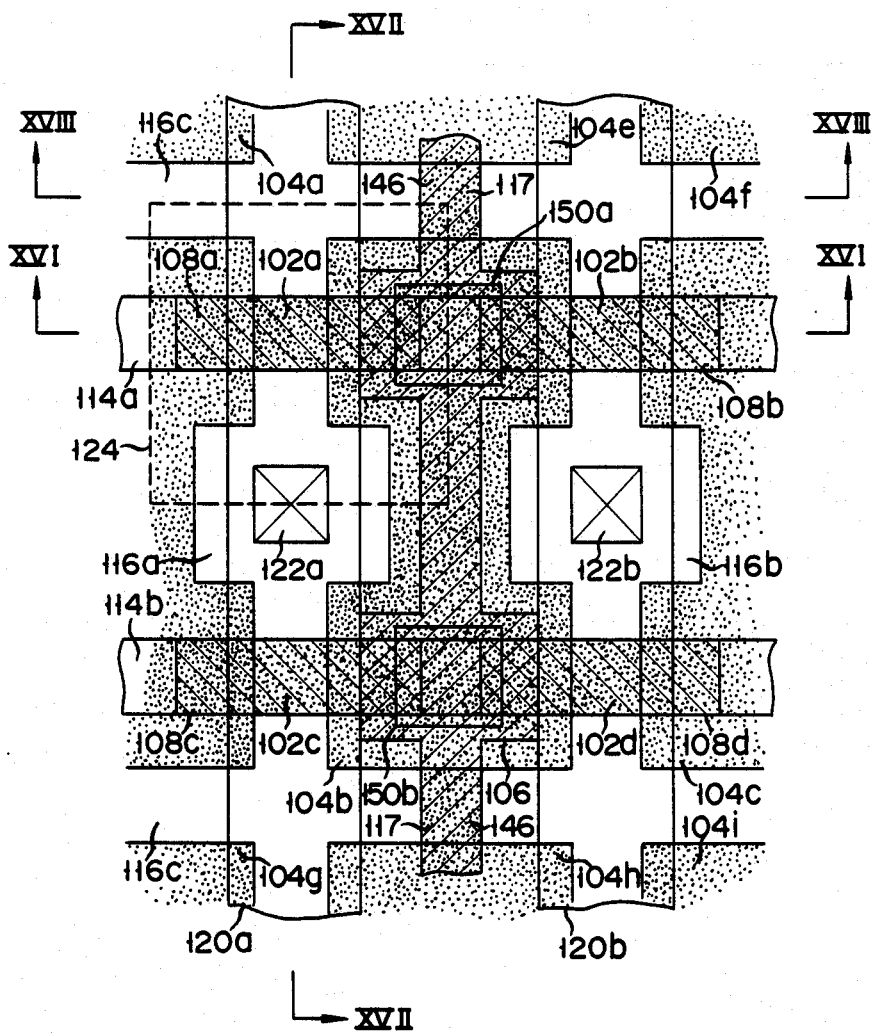
FIG. 15 is a plan view of the third embodiment of the semiconductor memory device according to the present invention.

The third embodiment of the semiconductor memory device according to the present invention will now be described with reference to FIGS. 15 to 18. FIG. 15 is a plan view of a 4-bit memory cell, FIG. 16 is a sectional view along the line XVI—XVI of FIG. 15, FIG. 17 is a sectional view along the line XVII—XVII of FIG. 15, and FIG. 18 is a sectional view along the line XVIII—XVIII of FIG. 15. Referring to FIG. 15, the doped regions of the semiconductor substrate are indicated by the clear areas, the oxide areas are indicated by the dotted areas, and the polycrystalline silicon members are indicated by the cross-hatched areas. A semiconductor memory device of the third embodiment is the same as that of the second embodiment except that insulating films, 150a and 150b which have a thickness of 2,000 to 3,000 Å are respectively formed between the first conductive layer 106 and third conductive layers 114a and 114b formed on the field insulating film 104b (FIGS. 15 and 16). The same reference numerals as in the second embodiment denote the same parts in the third embodiment, and the description thereof will be omitted.

The insulating films 150a and 150b are formed as described above so that the film thickness of the insulating film 160 between the first conductive layer 106 and the third conductive layers 114a and 114b can be made thicker. The insulating film 160 between the first conductive layer 106 and the third conductive layers 114a and 114b can be made thicker than the insulating film 110 which has a thickness of 500 to 1,000 Å and which is formed between the first conductive layer 106 and the second conductive layers 108a to 108d. In this embodiment, the thickness of the insulating film 160 formed between the first conductive layer 106 and the third conductive layers 114a and 114b is greater than the sum of the thickness of the insulating film 110 formed between the first conductive layer 106 and the second conductive layers 108a to 108d and the thickness of the insulating film 112 formed between the second conductive layers 108a to 108d and the third conductive layers 114a and 114b.

Therefore, since a strong electric field is effectively formed between the floating gate and the erase gate when a high voltage is applied to the erase gate (first conductive layer) 106 in order to discharge electrons from the floating gates (second conductive layers) 108a to 108d, electrons can be efficiently discharged. The leakage current does not flow between the erase gate and the control gate when data is erased from the floating gate, so that the current capacity of the voltage supply circuit which supplies a voltage of +40 V for erasing data may be small. Therefore, this high voltage may be generated from, for example, a power source of +5 V by using a booster which is mounted on the same chip. Further, if a voltage of +20 V for writing data is supplied from the power source of +5 V by using the booster, only a single power source is required for operating the semiconductor memory device. In the semiconductor memory device with the construction described above, a capacitance $C_{EC}$ between the first conductive layer 106 and the third conductive layers 114a and 114b may be made extremely small.

Figure 19A:
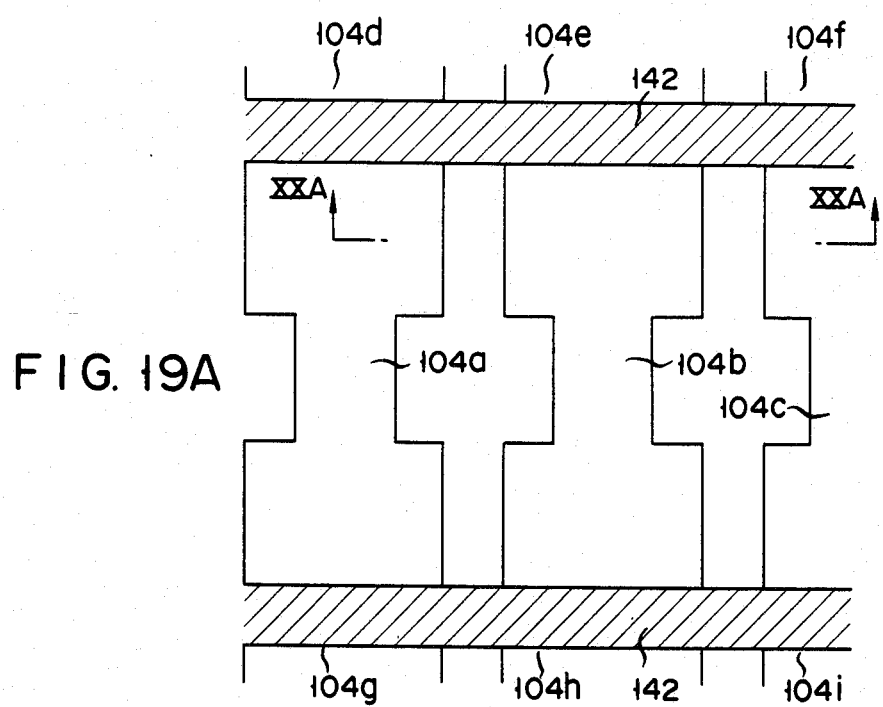
FIGS. 19A to 19E are plan views of the semiconductor substrate for explaining the method for manufacturing the semiconductor memory device according to the third embodiment of the present invention.
Figure 19B:
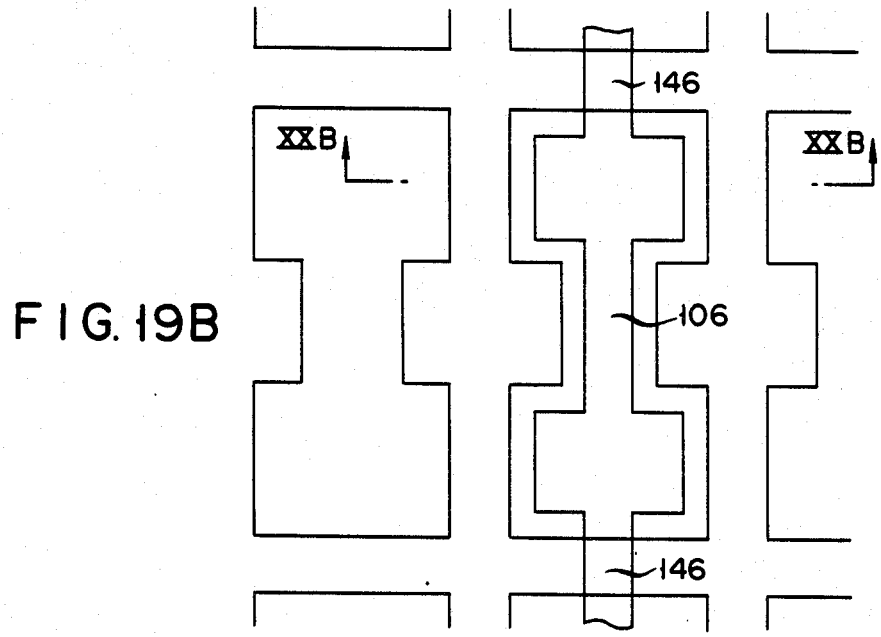
Figure 19C:
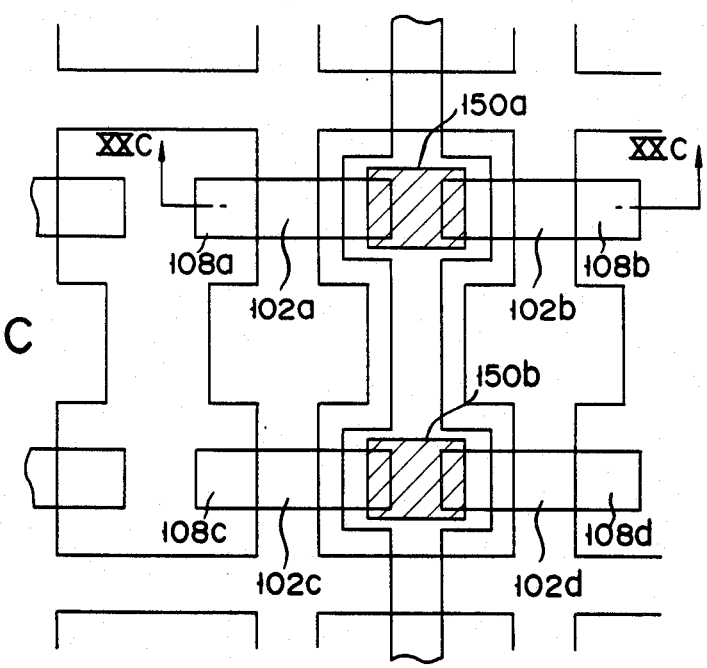
Figure 19D:
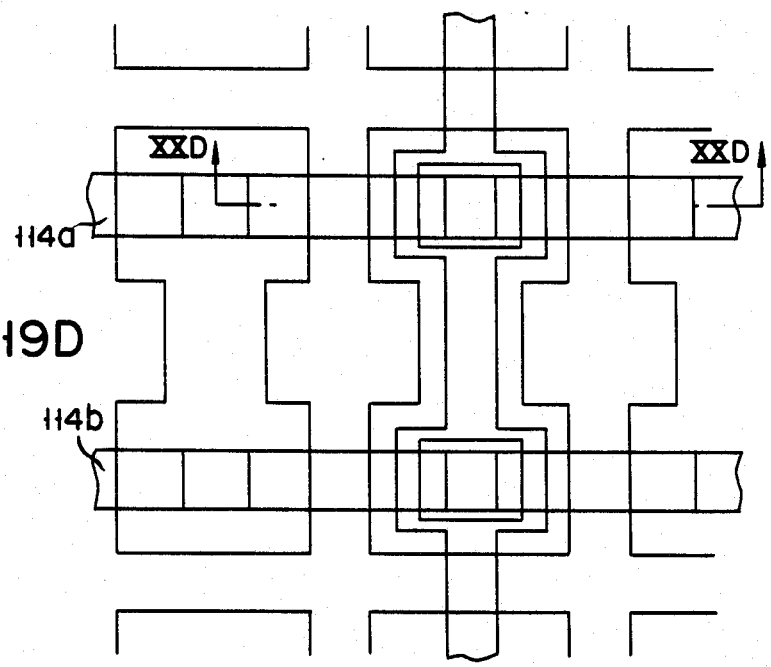
Figure 19E:
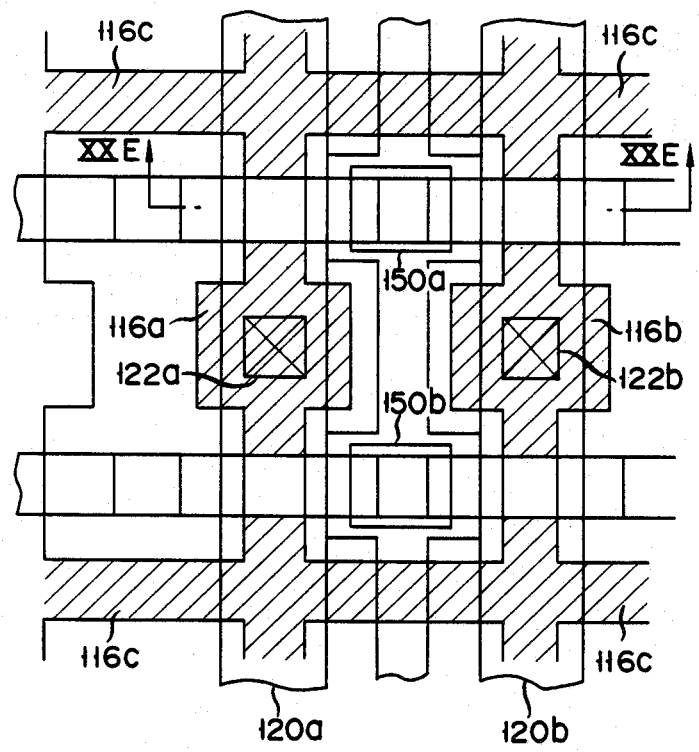

A method for manufacturing the semiconductor memory device according to the third embodiment of the present invention will be described with reference to FIGS. 19A to 19E and FIGS. 20A to 20E. FIGS. 19A to 19E are plan views of the semiconductor substrate, and FIGS. 20A to 20E are sectional views along the lines XXA—XXA, XXB—XXB, . . . , XXE—XXE, respectively, of FIGS. 19A to 19E. Steps for manufacturing this semiconductor memory device are substantially the same as those in the first embodiment described with reference to FIGS. 7A to 7E and FIGS. 8A to 8E, so that only different steps are described hereinafter. As shown in FIGS. 19C and 20C, after the first conductive layer 106 is formed, a polycrystalline silicon layer is deposited thereon and the second conductive layers 108a to 108d as the floating gates are formed by photolithography. On the entire surface an insulating film which has a thickness 2,000 to 3,000 Å is further deposited by the CVD method. The insulating film is then selectively etched to form insulating films 150a and 150b on the regions which are indicated by the cross-hatched lines as shown in FIG. 19C. Therefore, the insulating films 150a and 150b are formed on the first conductive layer 106 except for the areas which overlap through the insulating film 110 with the second conductive layers 108a to 108d and which are adjacent to the second conductive layers 108a to 108d.

The subsequent steps in this embodiment are the same as in the first embodiment, and the detailed description thereof will be omitted. According to the method for manufacuturing the semiconductor memory device as described above, the insulating layers 150a and 150b are deposited by the CVD method and the insulating film 160 interposed between the first conductive layer 106 and the third conductive layer 114a is made sufficiently thick as shown in FIG. 20E. Therefore, even if a high voltage is applied to the first conductive layer (erase gate) when data is erased from the floating gate, a leakage current does not substantially flow between the first conductive layer 106 and the third conductive layers (control gates) 114a and 114b. As a result, according to the method for manufacturing the semiconductor memory device described above, high performance data erasure can be performed electrically.

Figure 21:
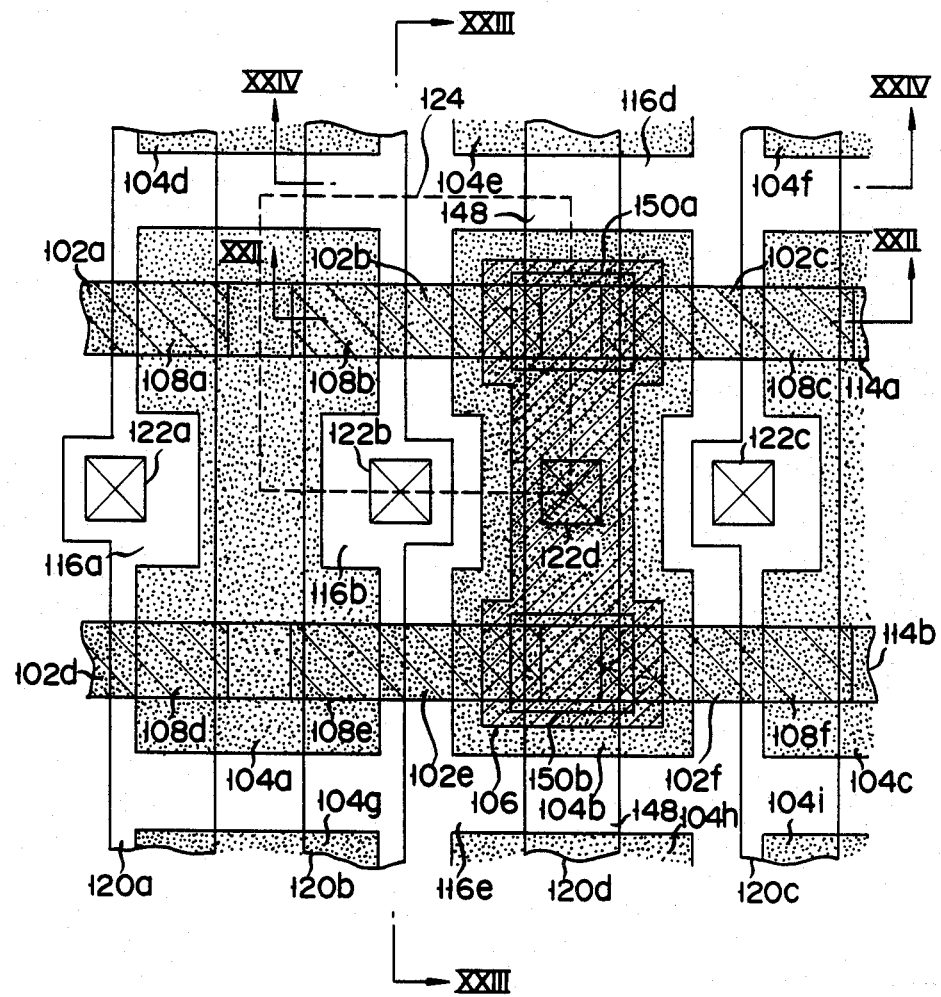
FIG. 21 is a plan view of the fourth embodiment of the semiconductor memory device of the present invention.
Figure 22:
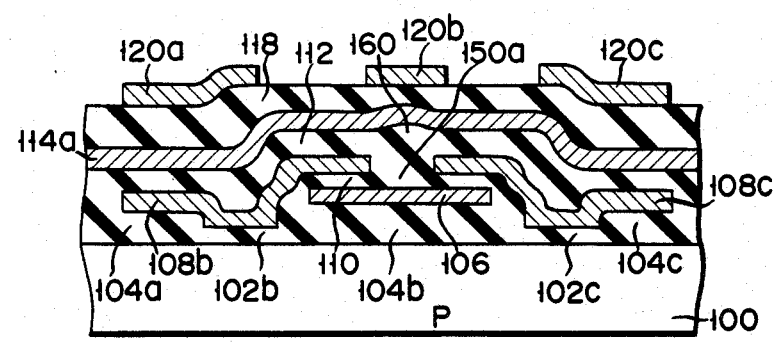
FIG. 22 is a sectional view along the line XXII—XXII of FIG. 21.
Figure 23:
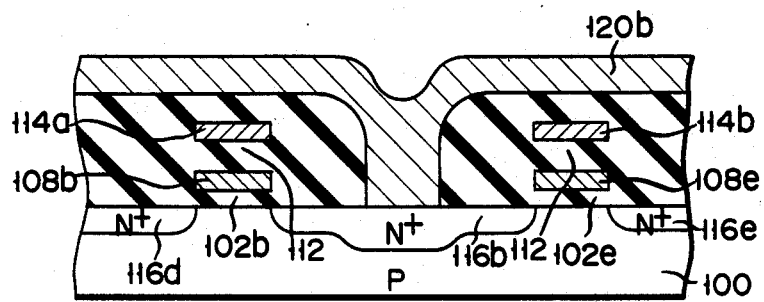
FIG. 23 is a sectional view along the line XXIII—XXIII of FIG. 21.
Figure 24:
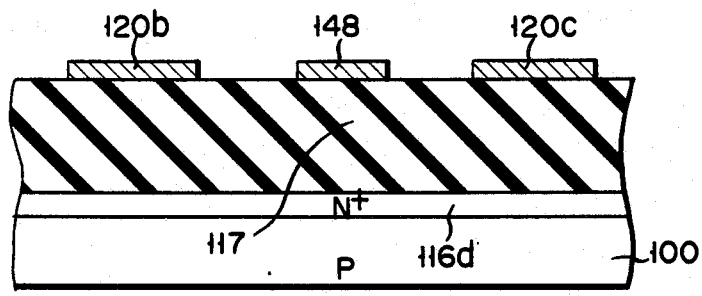
FIG. 24 is a sectional view along the line XXIV—XXIV of FIG. 21.

The fourth embodiment of the semiconductor memory device according to the present invention will be described with reference to FIGS. 21 to 24. FIG. 21 is a plan view of a plurality of memory cells, FIG. 22 is a sectional view along the line XXII—XXII of FIG. 21, FIG. 23 is a sectional view along the line XXIII—XXIII of FIG. 21 and FIG. 24 is a sectional view along the line XXIV—XXIV of FIG. 21. Referring to FIG. 21, the doped regions of the semiconductor substrate are indicated by clear areas, the oxide areas are indicated by dotted areas, and the polycrystalline silicon members are indicated by cross-hatched areas. The semiconductor memory device of this embodiment is the same as that shown in FIG. 9 except that the insulating films 150a and 150b are respectively further formed between the first conductive layer 106 in the form of an island formed on the field insulating film 104b and the third conductive layers 114a and 114b (FIGS. 21 and 22). Since the semiconductor memory device according to this embodiment has the same structure as that in FIG. 9, the same reference numerals denote the same parts as in FIG. 9 and the detailed description thereof will thus be omitted.

In the fourth embodiment above, the film thickness of the insulating film 160 between the first conductive layer 106 and the third conductive layers 114a and 114b can be made sufficiently thick by forming the insulating films 150a and 150b as in the case of the third embodiment. Therefore, the insulating film 160 formed between the first conductive layer 106 and the third conductive layers 114a and 114b is certainly made thicker than the insulating film 110 formed between the first conductive layer 106 and the second conductive layers 108a to 108d. Furthermore, the thickness of the insulating film 160 is greater than the sum of the thickness of the insulating film 110 between the first conductive layer 106 and the second conductive layers 108a to 108d and the thickness of the insulating film 112 between the second conductive layers 108a to 108e and the third conductive layers 114a and 114b. Therefore, the electrons are efficiently discharged from the floating gate in the same manner as in the preceding embodiments. As has also been described, only a single power source is required for operating the semiconductor memory device. Further, the capacitance $C_{EC}$ between the control gate and the erase gate is made small.

Figure 25A:
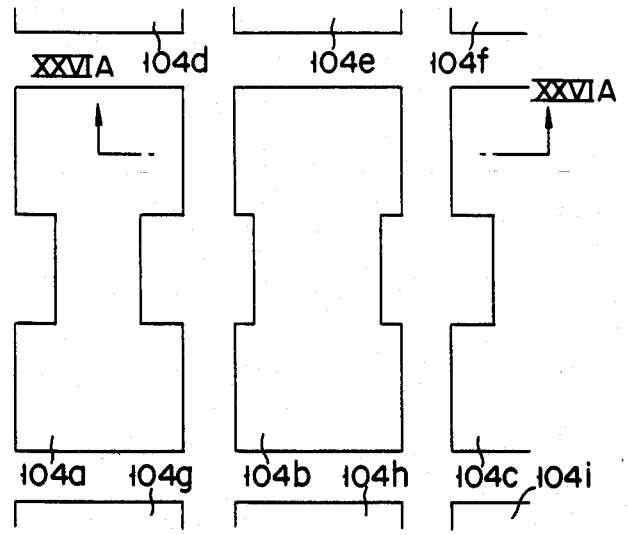
Figure 25B:
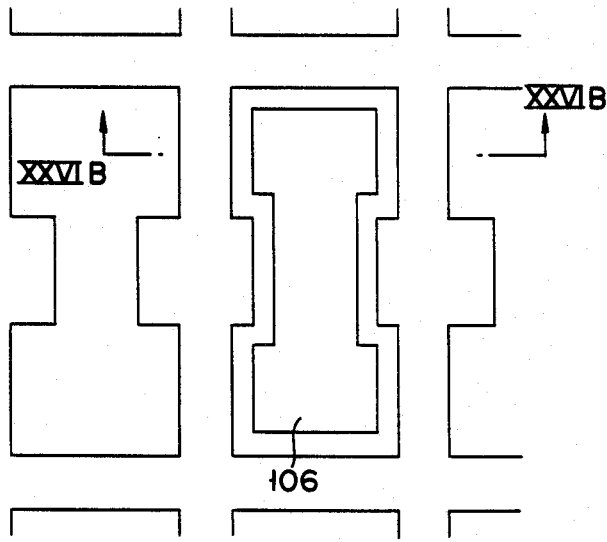
Figure 25C:
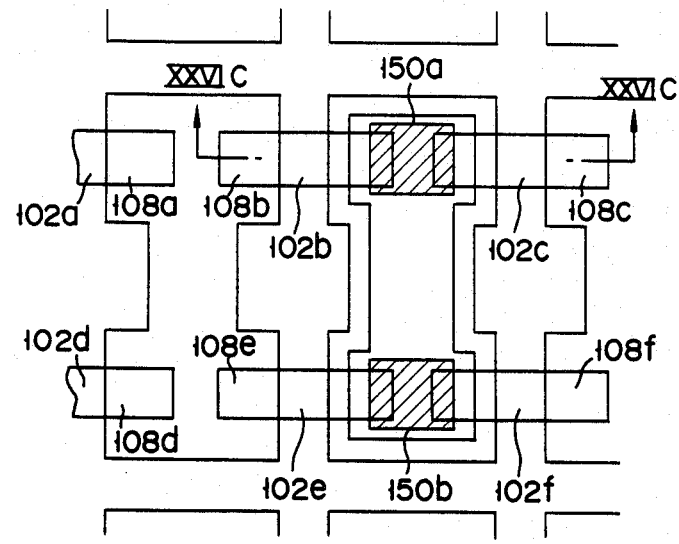
Figure 25D:
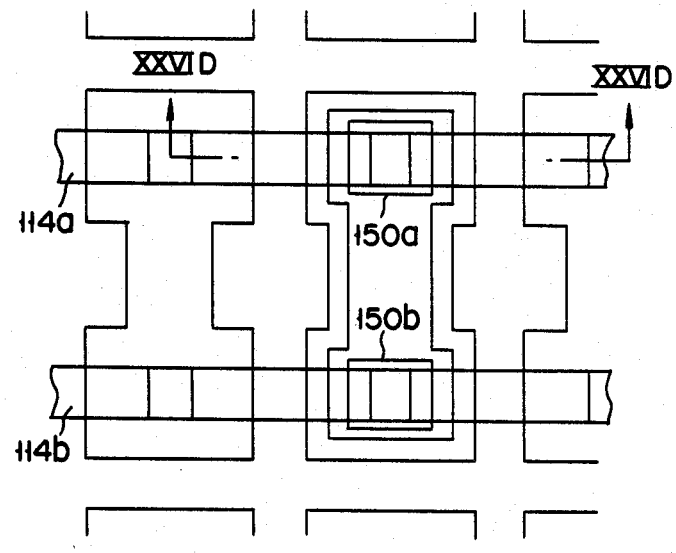
Figure 26A:
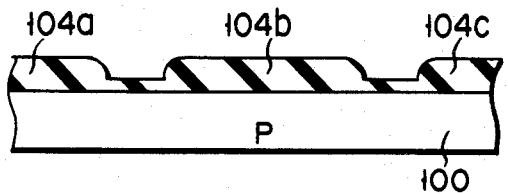
FIGS. 26A to 26E are sectional views along the lines XXVIA—XXVIA, XXVIB—XXVIB, . . . , XXVIE—XXVIE, respectively, of FIGS. 25A to 25E.
Figure 26B:
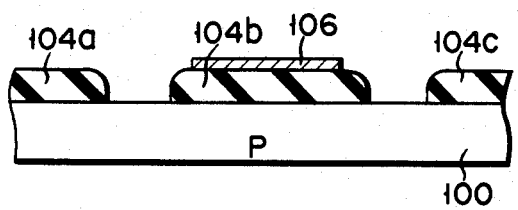
Figure 26C:
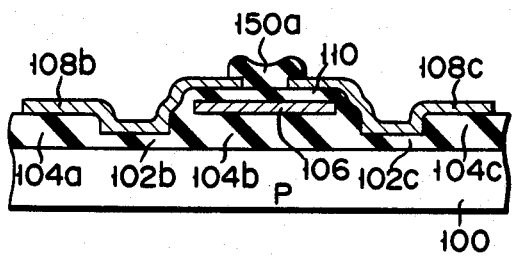
Figure 26D:
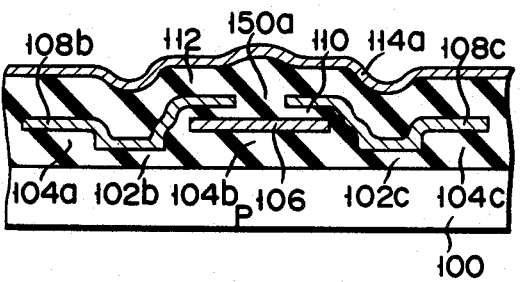

A method for manufacturing the semiconductor memory device according to the fourth embodiment of the present invention will now be described with reference to FIGS. 25A to 25E and FIGS. 26A to 26E. FIGS. 25A to 25E are plan views of the semiconductor substrate, and FIGS. 26A to 26E are sectional views along the lines XXVIA—XXVIA, XXVIB—XXVIB, . . . , XXVIE—XXVIE, respectively, of FIGS. 25A to 25E. Since steps for manufacturing the semiconductor memory device are substantially the same as those in the second embodiment shown in FIGS. 13A to 13E and FIGS. 14A to 14E, different steps are only described. As shown in FIGS. 25C and 26C, after the first conductive layer 106 in the form of an island is formed, a polycrystalline silicon layer is deposited thereon. Further, the second conductive layers 102a to 102f as the floating gates are etched by photolithography to form the second conductive layers 102a to 102f as the floating gates, and an insulating layer which has a thickness of 2,000 to 3,000 Å is deposited on the entire surface of the structure by the CVD method.

The insulating layer is then selectively etched to form the insulating films 150a and 150b in the areas indicated by the cross-hatched lines in FIG. 25C. The insulating film 150a is formed on the first conductive layer except for an area which overlaps with the second conductive layers 108b and 108c through the insulating film 110 and which is adjacent to the second conductive layers 108b and 108c. The insulating film 150b is formed on the first conductive layer except for an area which overlaps with the second conductive layers 108e and 108f through the insulating film 110 and which is adjacent to the second conductive layers 108e and 108f. The subsequent steps in this embodiment are the same as those in the second embodiment, and the description thereof will thus be omitted.

Figure 26E:
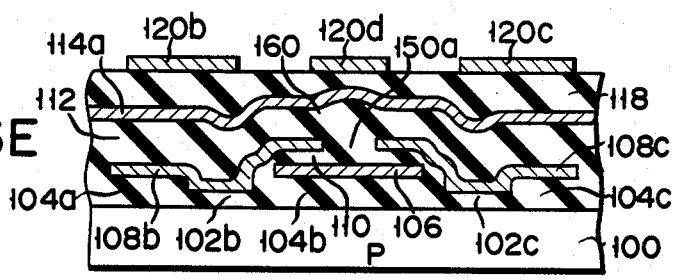

In accordance with the method for manufacturing the semiconductor memory device described above, as has been described in the third embodiment, the insulating films 150a and 150b are formed by the CVD method and the film thickness of the insulating film 160 interposed between the first conductive layer 106 and the third conductive layer 114a is made sufficiently thick as shown in FIG. 26E. Therefore, the semiconductor memory device described above also erases data from the floating gate electrically with high performance.

What we claim is:

1. A method for manufacturing a semiconductor memory device with a plurality of memory cells arranged in a matrix form, each said plurality of memory cells including a transistor having source and drain regions, said method comprising the steps of:

forming, on a semiconductor region of a first conductivity type, a plurality of field insulating films for separating said memory cells from each other;

selectively forming an erase gate on said field insulating films;

forming a first insulating film on said field insulating films and between said adjacent field insulating films, the portion of said first insulating film formed between said field insulating films serving as a gate insulation film;

selectively forming a floating gate on said gate insulation film, a portion of said floating gate overlapping a part of said erase gate with said first insulating film being interposed between said floating gate and said erase gate;

selectively forming a second insulating film on the portion of said first insulating film formed on said erase gate;

forming a third insulating film on said floating gate and said second insulating film; and forming a control gate on said third insulating film, said control gate being formed over said erase gate with said first, second and third insulating films being interposed between said control gate and said erase gate, said control gate being insulated from said erase and floating gates and overlapping said portion of said floating gate which overlaps said part of said erase gate.

2. The method according to claim 1 wherein said second insulating film forming step includes the step of using said CVD method.

3. The method according to claim 2 wherein said film forming step includes the step of forming said first insulating film thinner than said field insulating film.

4. The method according to claim 3 wherein said erase and floating gate forming steps include the steps of using polycrystalline silicon to form said gates.

5. The method according to claim 3 wherein said erase and floating gate forming steps include the steps of using molybdenum to form said gates.

* * * * *